US012540386B2

(12) United States Patent
Kim

(10) Patent No.: US 12,540,386 B2
(45) Date of Patent: Feb. 3, 2026

(54) ELECTRON-BEAM-ASSISTED SPUTTERING DEVICE AND METHOD THEREFOR

(71) Applicant: INFOVION INC., Bucheon-si (KR)

(72) Inventor: Yong Hwan Kim, Goyang-si (KR)

(73) Assignee: INFOVION INC., Bucheon-si (KR)

( * ) Notice: Subject to any disclaimer, the term of this patent is extended or adjusted under 35 U.S.C. 154(b) by 0 days.

(21) Appl. No.: 18/712,046

(22) PCT Filed: Nov. 19, 2022

(86) PCT No.: PCT/KR2022/018367
§ 371 (c)(1),
(2) Date: May 21, 2024

(87) PCT Pub. No.: WO2023/090957
PCT Pub. Date: May 25, 2023

(65) Prior Publication Data

US 2025/0019819 A1 Jan. 16, 2025

(30) Foreign Application Priority Data

Nov. 22, 2021 (KR) ........................ 10-2021-0161803

(51) Int. Cl.
*C23C 14/35* (2006.01)
*H01J 37/32* (2006.01)
*H01J 37/34* (2006.01)

(52) U.S. Cl.
CPC ........ *C23C 14/355* (2013.01); *H01J 37/3244* (2013.01); *H01J 37/3402* (2013.01)

(58) Field of Classification Search
None
See application file for complete search history.

(56) References Cited

U.S. PATENT DOCUMENTS

2002/0108847 A1* 8/2002 Cuomo ............... C23C 14/3428 204/192.15
2006/0225998 A1* 10/2006 Song ................. H01J 37/32724 204/298.04

FOREIGN PATENT DOCUMENTS

JP 0874052 A 3/1996
JP 2014034698 A 2/2014

(Continued)

OTHER PUBLICATIONS

International Search Report corresponding to related International Application No. PCT/KR2022/018367, mailed Feb. 21, 2023, 5 pages.

*Primary Examiner* — Jason Berman
(74) *Attorney, Agent, or Firm* — Crowell & Moring LLP

(57) ABSTRACT

The present disclosure provides an electron-beam-assisted sputtering device and a method therefor, the device adding, as an electron supply means, an electron beam supply module to a conventional plasma sputtering device, so as to lower the process pressure of sputtering, thereby improving the quality of a deposition thin film. The electron-beam-assisted sputtering device of the present disclosure comprises: a vacuum chamber filled, at a certain process gas pressure, with a process gas for plasma formation; a target which is mounted in the vacuum chamber and to which power is supplied; a substrate onto which a sputtered target atom flies and is deposited due to the forceful collision, with the target, of a cation of the process gas present in the plasma formed on the surface of the target; and an electron beam supply module for supplying electrons toward the surface of the target on which the plasma is formed.

20 Claims, 9 Drawing Sheets

(56) References Cited

FOREIGN PATENT DOCUMENTS

| | | | |
|---|---|---|---|
| KR | 10-2000-0041637 | A | 7/2000 |
| KR | 10-2001-0093511 | A | 10/2001 |
| KR | 10-0838045 | A | 6/2008 |
| KR | 10-2009-0033662 | A | 4/2009 |
| KR | 10-2011-0009872 | A | 1/2011 |
| KR | 10-1155932 | B1 | 6/2012 |
| KR | 10-2016-0029041 | A | 3/2016 |
| KR | 10-2019-0119274 | A | 10/2019 |

* cited by examiner

ELECTRON-BEAM-ASSISTED SPUTTERING DEVICE AND METHOD THEREFOR

CROSS REFERENCE TO RELATED APPLICATIONS

The present application is a National Stage of International Application No. PCT/KR2022/018367 filed on Nov. 19, 2022, which claims the benefit of Korean Patent Application No. 10-2021-0161803 filed on Nov. 22, 2021, the entire contents of each hereby incorporated by reference.

TECHNICAL FIELD

The present disclosure relates to an electron-beam-assisted sputtering device and a method therefor, and more specifically, to an electron-beam-assisted sputtering device for improving quality of a deposited thin film sputtered using an electron beam and a method therefor.

BACKGROUND

In response to the recent advancement of semiconductor device design rules to increasingly fine line widths of 7 nm, 5 nm, 3 nm, and even 2 nm, various thin film deposition methods are being researched to ensure that thin films having fine line width are more densely organized, that there are no defects inside the thin films, and that the surface roughness of the thin films is reduced.

Thin films deposited by magnetron sputtering typically contain around 5.5 defects per 60 nm. In contrast, thin films deposited by Ion Beam Sputter Deposition (IBD) exhibit a much denser structure with approximately one-fifth the defects, around 1 per 50 nm, and hence, IBD is garnering attention as a film deposition method for obtaining a high-quality semiconductor thin film.

However, IBD has drawbacks such as a deposition rate approximately one-tenth that of conventional magnetron sputtering, as well as complexities in positioning an ion beam, a target, and a substrate, along with the selection of angles for the ion beam and the target, a flight angle of sputtered deposition particles, and shorter cleaning cycles and difficulties in the cleaning process due to contamination in the dielectric chamber within the ion beam source, which lead to maintenance challenges not present in existing sputtering method, and for these reasons, it has been difficult to apply the IBD to existing semiconductor fabrication processes.

Furthermore, as both the semiconductor and display industries are moving towards advanced high-density displays with increasingly finer pixel sizes, there is a growing industry demand for new methods to enhance the quality of thin films, overcoming the limitations of conventional sputtering methods currently employed in production processes.

RELATED DOCUMENT (Patent Document 1) Korean Patent No. 10-0838045

SUMMARY

Technical Problems

The present disclosure has been developed to meet the needs of the industries, and aims to provide an electron-beam-assisted sputtering device and a method therefor with an electron beam supply module added as an electron supply means to a conventional plasma sputtering device to improve the quality of a deposited thin film by reducing the process pressure of sputtering.

Technical Solution

In order to achieve the above objective, an electron-beam-assisted sputtering device of the present disclosure includes: a vacuum chamber where process gas for formation of a plasma is filled at a predetermined process gas pressure: a target mounted within the vacuum chamber and supplied with power: a substrate where target atoms, sputtered by strong collision with the target by cations of the process gas present in the plasma formed on a surface of the target, are deposited: and an electron beam supply module for supplying electrons toward the surface of the target where the plasma is formed.

Further, the process gas pressure may be in a range of 1×10-5 to 5×10-3 torr, and more preferably, the process gas pressure may be in a range of 1×10-5 to 5×10-4 torr.

Further, the vacuum chamber may further include a process gas supply installed within the vacuum chamber to supply the process gas to the surface of the target, and a shielding plate may be installed on the process gas supply to direct the process gas to the surface of the target.

Further, the target and the substrate may be installed on first and second sides of the vacuum chamber, which are opposing each other, and the electron beam supply module may be installed on a different side other than the first and second sides, where the target and the substrate are installed, not to face the target.

Further, at a circumference of a pipe where the electron beam supply module and the target is mounted, a magnetic field generating means may be installed on one or both sides to direct a flight direction of an electron beam irradiated by the electron beam supply module toward the target, and the magnetic field generating means may be an electromagnet or a permanent magnet.

Further, the electron beam supply module may supply an electron beam toward the target and supply an electron beam toward the substrate.

Further, the electron beam supply module may supply an electron beam toward the target and supply an electron beam toward the substrate by using a single electron beam supply module, and the electron beam supply module may be provided as two or more electron beam supply modules, and the supplying of an electron beam toward the target and the supplying of an electron beam toward the substrate may be performed by separate electron beam supply modules.

Further, an ion beam source may be installed in the vacuum chamber to irradiate the surface of the target with an ion beam to sputter the target atoms.

Further, the target may be a target of magnetic material.

Meanwhile, in an electron-beam-assisted sputtering method of the present disclosure to achieve the above object, a vacuum chamber may be filled with a process gas at a predetermined process gas pressure to form a plasma within the vacuum chamber, power may be supplied to a target mounted within the vacuum chamber, and target atoms, sputtered by strong collision with the target by cations of the process gas present in the plasma formed on a surface of the target, may be then deposited on the substrate, and an electron beam may be irradiated from an electron beam supply module installed in the vacuum chamber toward the plasma formed on the surface of the target.

In this case, the process gas pressure may be controlled within a range of 1×10-5 to 5×10-3 torr, and, preferably, the process gas pressure may be controlled within a range of 1×10-5 to 5×10-4 torr.

Further, the process gas may be separately supplied to the surface of the target via a process gas supply installed inside the vacuum chamber.

Further, by a magnetic field generating means installed at the electron beam supply module and a circumference of the target, a direction of the electron beam irradiated from the electron beam supply module may be directed toward the target.

Further, the electron beam supply module may irradiate the target with an electron beam during plasma sputtering deposition, and then irradiate the substrate with an electron beam after the plasma sputtering deposition is fully or partially completed.

Effect

In the electron-beam-assisted sputtering device and a method therefor according to the present disclosure, as the process gas pressure in a vacuum chamber is lowered while the same configuration of a conventional plasma sputtering device is used, the collisions with the process gas are minimized as much as possible during the flight of sputtered target atoms towards the substrate to thereby minimize the energy loss of the sputtered atoms, so that the sputtered atoms can be deposited on the substrate with high energy retention, and as a result, it is possible to achieve a high-quality thin film deposited with high film density, low surface roughness, and a significantly reduced number of defects per unit area.

In addition, according to the present disclosure, without using an ion beam sputtering device, it is possible to achieve a thin film of equal quality to that obtained through ion beam sputtering deposition, without the use of an ion beam sputtering device. As a result, by using an ion beam source, it is also possible to prevent in advance contaminants from entering a deposited thin film due to the space charge effect of an ion beam.

In addition, according to the present disclosure, it is possible to use a previously unavailable magnetic material target.

DETAILED DESCRIPTION

A description will now be given in detail according to exemplary embodiments disclosed herein, with reference to the accompanying drawings, the same or like elements may be provided with the same or like reference numbers, and description thereof will not be repeated. In addition, in the following description of the embodiments of the present disclosure, a detailed description of known functions and configurations incorporated herein will be omitted when it may impede the understanding of the embodiments.

While terms including ordinal numbers, such as "first" and "second," etc., may be used to describe various elements, such elements are not limited by the above terms. These terms are generally only used to distinguish one element from another.

As used herein, the singular forms "a", "an," and "the" are intended to include the plural forms as well, unless the context clearly indicates otherwise.

In this application, the described steps may be carried out in any sequence, except in cases where a clearly defined cause-and-effect relationship necessitates a specific order.

It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Hereinafter, an electron-beam-assisted sputtering device and a method therefor according to an embodiment of the present disclosure will be described in detail with reference to the attached drawings.

Figure 1:
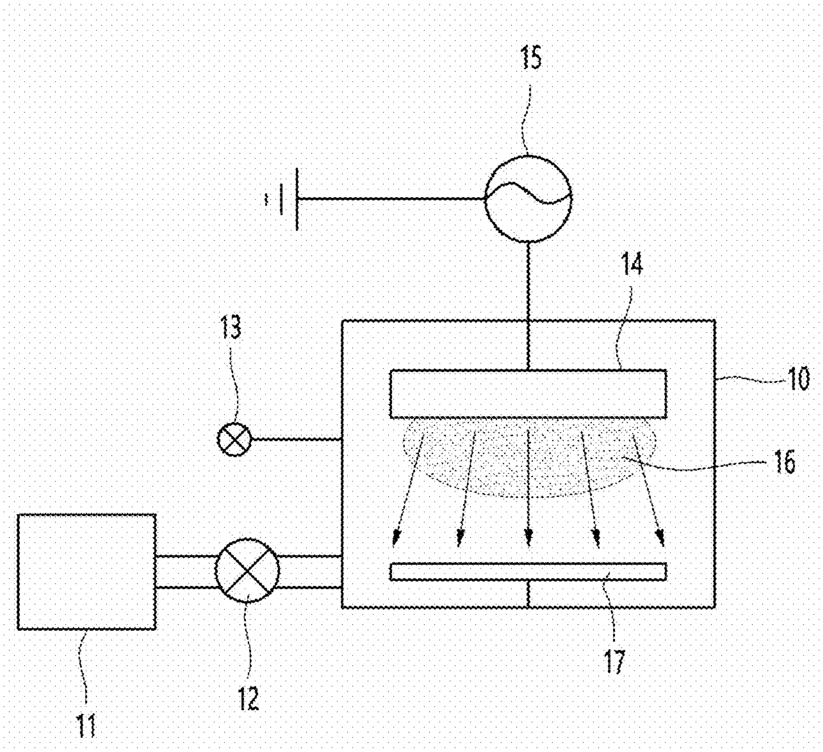
FIG. 1 is a diagram illustrating a conventional plasma sputtering device.

FIG. 1 is a diagram illustrating a conventional plasma sputtering device.

According to a plasma sputtering device, when power 15 is supplied to a target 14 in a vacuum chamber 10 and an external magnetic field is applied, a plasma 16, which is a collection of ions and electrons, is formed on the surface of the target 14, and when positively charged ions within the plasma 16 are accelerated and collide towards the target 14 connected to a cathode, target particles become dislodged and fly towards a substrate 17, resulting in deposition of a thin film. Such a phenomenon where target particles become dislodged through target etching using a plasma and are then deposited onto a substrate is called sputter deposition.

The plasma sputtering requires the maintenance of the plasma 16 to induce sputtering by a plasma and to create deposition therefrom. The plasma may be sustained only when a continuous supply of electrons, countless times escaping from the plasma, is provided. This supply of electrons is provided through a current supply from the power 15 connected to the target 14. The electrons supplied to the target 14 are emitted into a space where the plasma 16 is located, and while flying with energy, the emitted electrons collide with process gas atoms present in the plasma, ionizing the gas atoms and creating additional electrons.

The collision of electrons with gas atoms in the second and third successive avalanching bursts eventually becomes the primary mechanism sustaining a plasma composed predominantly of gas ions and electrons. The plasma is sustained if there is a delicate balance between the number of electrons generated through collisions of electrons with process gas and the number of electrons escaping from the plasma, but if the pressure of the gas is low and the number of collisions of electrons become small, the generation of new electrons diminishes, leading to the eventual dissipation of the plasma. Therefore, the gas pressure in the vacuum chamber, which is responsible for forming the plasma, must be greater than or equal to a predetermined threshold (10-3 torr) to ensure a high likelihood of electrons colliding with gas atoms.

This process gas pressure is controlled by a vacuum pump 11 connected to the vacuum chamber 10 via a valve 12, and the gas atoms, typically an inert gas such as argon (Ar), responsible for forming the plasma, are supplied via a gas supply port 13.

In addition, target atoms etched during sputtering typically bounce off and fly away with an energy of 5 to 20 eV, and while traveling toward the substrate, the target atoms collide with the process gas in the vacuum chamber 10 on average every approximately 1 cm when the process pressure is in the range of 10-3 torr, and thus, the etched target atoms collide dozens of times before reaching the substrate, resulting in a significant loss of energy upon deposition on the substrate. As a result, a deposited thin film is not dense and undergoes columnar growth, with many vacancies or defects, resulting in process gas entrapment and low density deposition.

These problems in the plasma sputtering process may be solved by reducing the process pressure to about 10-4 torr to 10-5 torr to limit the number of collisions of the target atoms to almost one or less prior to the deposition, yet, as described earlier, when the process pressure decreases, the number of electrons generated decreases and the plasma cannot be sustained, and thus, it is not possible to reduce the process pressure below a predetermined threshold. Therefore, even with a conventional plasma sputtering device, there is a technical limitation that the quality of a deposited thin film cannot be enhanced beyond a certain level.

However, an ion beam sputtering device has recently drawn attention as a way to overcome the technical limitation of plasma sputtering devices and obtain high-quality deposited thin films.

Figure 2:
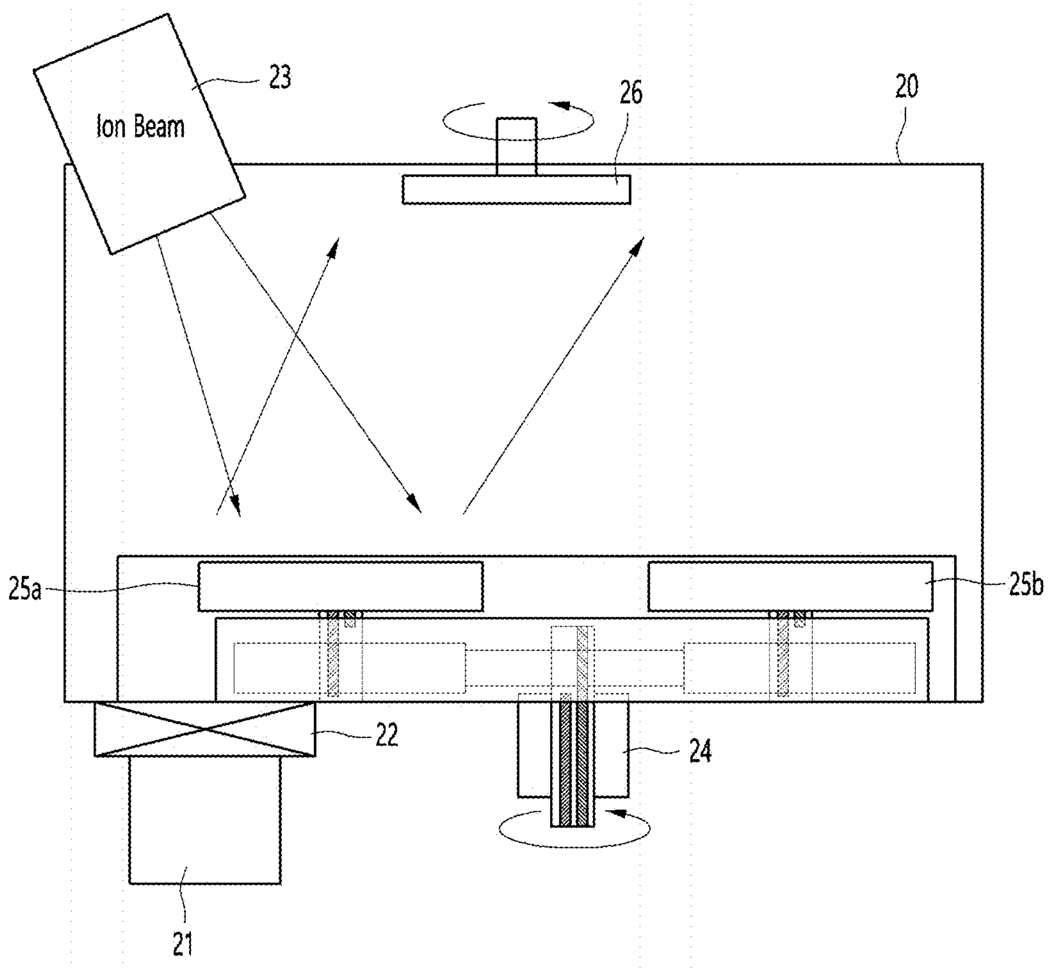
FIG. 2 is a diagram illustrating a conventional ion beam sputtering device facing a target.

FIG. 2 shows a conventional ion beam sputtering device.

In the ion beam sputtering device, while a vacuum chamber 20 is maintained at a certain process gas pressure (~10-4 torr) by a vacuum pump 21 connected via a valve 22, gas ions with high energy within an ion beam source 23 are emitted towards targets 25*a* 25*b*. The targets 25*a* and 25*b* are provided as a plurality of targets to create deposition layers of various elements, and these targets 25*a* and 25*b* are rotatably mounted on a target mounting table 24. Although FIG. 2 illustrates an example in which the targets 25*a* and 25*b* formed of two different materials are mounted on the target mounting table 24, aspects of the present disclosure are not limited thereto and three or more targets may be mounted.

When gas ions emitted from the ion beam source 23 are accelerated and collide with the targets 25*a* and 25*b*, the collision causes target atoms to become dislodged and fly towards a substrate 26, resulting in the deposition of a thin film. Unlike the plasma sputtering device described above with reference to FIG. 1, no plasma is formed on the surfaces of the targets 25*a* and 25*b*, and therefore, it is not necessary to maintain the process gas pressure at a predetermined threshold (such as 10-3 torr or greater) to sustain a plasma, and hence, the ion beam sputtering device may be able to maintain a low process gas pressure, typically 10-4 torr or lower, as previously described.

At low process gas pressure, the number of collisions of the etched target atoms with the process gas in the vacuum chamber 20 during ion beam sputtering is greatly reduced, and hence, the target atoms may reach and deposit onto the substrate 26 while retaining the high energy from the sputtering process, leading to the formation of a dense and low-defect deposited film. For these reasons, the ion beam sputtering device may yield a higher-quality deposition film compared to a plasma sputtering device.

However, in the ion beam sputtering device, during the flight of the high-energy ion beam irradiated from the ion beam source 23 toward the targets 25*a* and 25*b*, the space charge effect of the ion beam, i.e., the repulsive force between ions with the same positive charges, causes ion balls deviating from the flight path to strike the device components around the targets, causing sputtering and becoming sources of contamination, and if deposited along with the target atoms on the substrate, the contaminants may become defects and adversely affect the quality of a deposited thin film.

The present disclosure has been developed to address drawbacks of the two sputtering devices by enabling the maintenance of low process gas pressure through an electron beam device, similarly to the ion beam sputtering device of FIG. 2, while utilizing the plasma sputtering device of FIG. 1. In other words, the electron beam-assisted sputtering device of the present disclosure may sustain a plasma even at low process gas pressure within the vacuum chamber by supplying sufficient electrons via the electron beam, and consequently, collisions of sputtered target atoms may be minimized, allowing the target atoms to be deposited onto a substrate while retaining high energy, resulting in the formation of a dense deposited film, and since an ion beam source is not utilized, contamination of components around a target due to ion beam sputtering may be prevented.

Hereinafter, various embodiments of an electron-beam-assisted sputtering device and a method therefor according to the present disclosure will be described in detail with reference to FIGS. 3 to 9.

Figure 3:
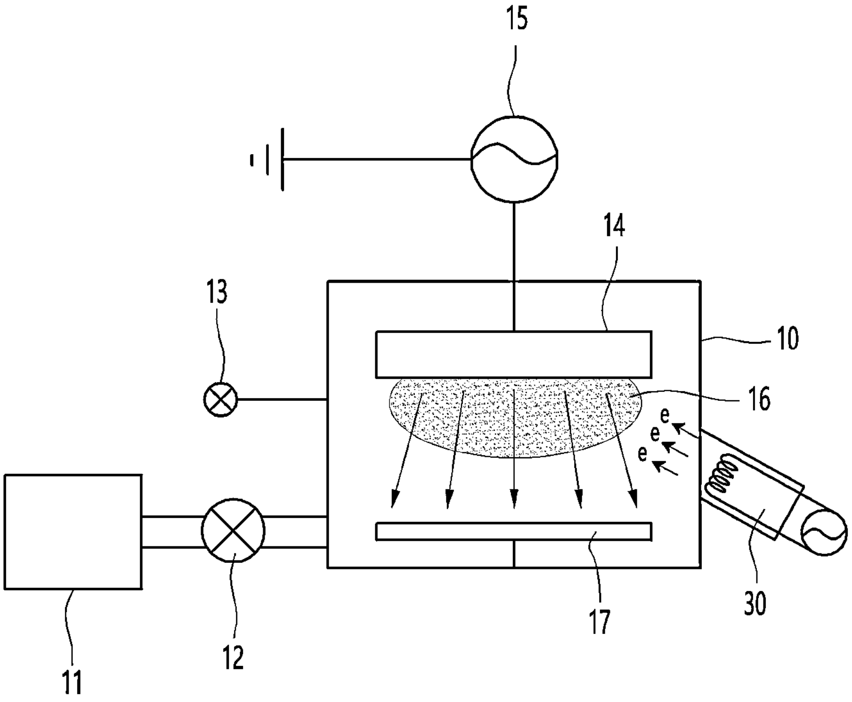
FIG. 3 is a diagram illustrating the basic concept of an electron-beam-assisted sputtering device and a method therefor according to the present disclosure.

FIG. 3 is a diagram illustrating the basic concept of an electron-beam-assisted sputtering device and a method therefor according to the present disclosure.

The electron-beam-assisted sputtering device is basically similar in configuration to the plasma sputtering device described with reference to FIG. 1. That is, when a target 14 in a vacuum chamber 10 is supplied with power 15 to be charged with negative charges and then an external magnetic field is applied, a plasma 16, which is a collection of ions and electrons, is formed on a surface of the target 14. When process gas having positive charges in the plasma 16 are accelerated and collide with the target 14 connected to a cathode, target particles become dislodged and fly toward the substrate 17, thereby resulting in the deposition of a thin film.

In this case, the plasma may be sustained only when a continuous supply of electrons, countless times escaping from the plasma, is provided. This supply of electrons is provided through a current supply from the power 15 connected to the target 14. The electrons supplied to the target 14 are emitted into a space where the plasma 16 is located, and while flying with energy, the electrons collide with gas atoms present in the plasma, ionizing the gas atoms and generating additional electrons. In this case, if the pressure of process gas is low and the number of collisions between the electrons and the gas atoms decreases, the number of newly generated electrons also decreases, and thus, the plasma may dissipate. Therefore, conventionally, the gas pressure in a space forming a plasma is maintained above a certain standard (~10-3 torr) to ensure the probability of collision of electrons with gas atoms.

However, if the process gas pressure in the vacuum chamber 10 is high, the target atoms torn apart during sputtering may collide with the process gas on average every approximately 1 cm during the flight toward the substrate. Consequently, the target atoms may collide dozens of times before reaching the substrate, resulting in a significant loss of energy upon deposition on the substrate. Therefore, the deposited thin film exhibits low density, columnar growth, and numerous vacancies or defects, leading to process gas entrapment and the formation of a low-density deposited film, as described above with reference to FIG. 1.

The electron-beam-assisted sputtering device of the present disclosure reduces the process gas pressure in the vacuum chamber 10 to a significantly lower level than existing technologies to minimize sputtered target atoms from colliding with vacuum gas, allowing the target atoms to maintain high energy levels upon deposition onto the substrate, and in order to prevent plasma dissipation due to low pressure, electrons are separately supplied to the surface of target 14 through a separately installed electron beam supply module 30, ensuring a sufficient supply of electrons to sustain the plasma even at low process gas pressure.

The process gas pressure is controlled by a vacuum pump 11 connected to the vacuum chamber 10 and the valve 12, and the gas atoms, typically an inert gas such as argon (Ar), responsible for forming the plasma, are supplied via a gas supply port 13. According to the present disclosure, while using a conventional plasma sputtering device, the process gas pressure may be adjusted within a range of 1×10-5 to 5×10-3 torr, which is lower than that of existing technologies.

When the process gas pressure is lower than 1×10-5, the number of process gas atoms become so small that the effective number of collisions of electrons with the process gas atoms required to sustain the plasma cannot be obtained even if electrons are supplied separately through the electron beam supply module, and when the process gas pressure is higher than 5×10-3, the number of collisions of the sputtered target atoms with the process gas become large, resulting in greater energy loss and thus making it difficult to achieve the purpose of the present disclosure, which is to improve the quality of a deposited thin film.

More preferably, the process gas pressure may be adjusted within an optimized range of 1×10-5 to 5×10-4 torr, and even at such a low pressure, the plasma may be sustained with the number of electrons supplied by the electron beam supply module 30, and there is no Mirco arc due to excessive ion collisions that occur when the process gas pressure is high, so there are fewer macro particles and only small-sized target atoms may be deposited on the substrate while maintaining high energy, and thus, a fine deposited thin film with high density and low surface roughness may be obtained.

In this case, the electron beam supply module 30 may be implemented using a method of supplying thermal electrons by heating a tungsten filament as shown in FIG. 3, a method of using field emission electrons from a metallic electrode such as tungsten with direct current power applied, a method of using electron beam supply by selectively extracting only electrons from a plasma, etc.

In this case, the plasma may be any of the following: a plasma generated by RF power supply by an ICP or TCP antenna in the vacuum chamber 10 filled with process gas, a plasma generated by a hollow cathode, a plasma generated by thermoelectricity supplied by heating a filament electrode, etc. In addition, the power 15, which is separately connected to the target 14 during sputtering deposition through electron beam irradiation, may be in the form of DC, pulsed DC, RF, etc. for metal targets, but it is preferable to use pulsed DC or RF for semiconductors such as ceramics or Si.

Figure 4:
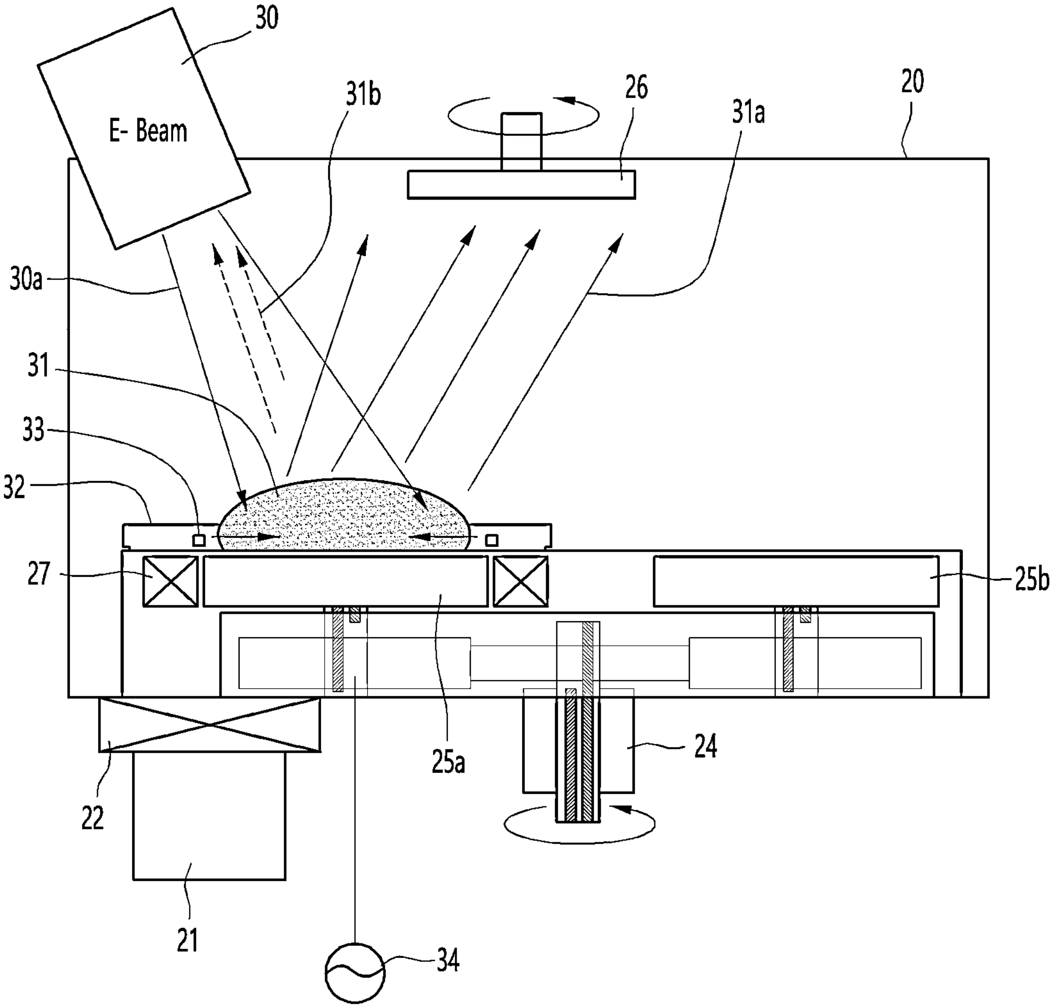
FIG. 4 is a diagram illustrating a first embodiment of an electron-beam-assisted sputtering device directed to a target and a method therefor according to the present disclosure.

FIG. 4 is a diagram illustrating a first embodiment of an electron-beam-assisted sputtering device directed to a target and a method therefor according to the present disclosure.

According to this embodiment, the electron-beam-assisted sputtering device irradiates a target with an electron beam, while maintaining a constant process gas pressure (in the range of 1×10-5 to 5×10-3 torr) in a vacuum chamber 20 by a vacuum pump 21 connected via a valve 22. In this case, if power 34 is supplied to one of two targets **25*a* and 25*b*, which is at position where the electron beam is irradiated, a plasma may be formed on the target, resulting in sputtering at low pressure. Then, if an external magnetic field 27 is applied around the target, electrons may become more concentrated, resulting in the formation of a plasma 31, which is a collection of ions and electrons, with a higher density on the surface of the target. In this plasma 31, if process gas ions having positive charges are accelerated and collide with the cathode-connected targets 25*a* and 25*b*, target particles may become dislodged and fly toward a substrate 26**, resulting in the deposition of a thin film.

In a conventional plasma sputtering device, when the process gas pressure in the vacuum chamber 20 is maintained low within the range of 1×10-5 to 5×10-3 torr, a plasma may not be sustained due to the insufficient number of electrons required to produce a plasma by colliding with the process gas atoms. However, according to one embodiment of the present disclosure, the electron-beam-assisted sputtering device is configured to irradiate the surfaces of the targets **25*a* and 25*b*, where the plasma 31 is formed, with an electron beam from an electron beam supply module 30 installed within the vacuum chamber 20, and by doing so, it is possible to provide a continuous supply of the necessary electrons into the plasma 31**.

As described above with reference to FIG. 2, it is not necessary for the ion beam sputtering device to generate and sustain a plasma, so it is possible to maintain the process gas pressure in the vacuum chamber at 10-4 torr or less, and since collisions with the process gas are minimized, target atoms sputtered by the irradiation of an ion beam are deposited onto a substrate with high energy, resulting in the production of a high-quality deposited thin film. Therefore, if the process gas pressure can be reduced even in a conventional plasma sputtering device, it is possible to deposit a thin film of the same quality as that in the ion beam sputtering device.

The main key to achieving the above is to sustain a plasma even at low process gas pressure. Ensuring a continuous and sufficient supply of electrons to keep the plasma active is the most crucial factor in sustaining the plasma even at low process pressure to maintain the sputtering process.

In one embodiment of the present disclosure, the electron beam supply module 30 is separately installed in the vacuum chamber 20, and the electron beam supply module 30 irradiates a sufficient amount of electron beam **31*a* onto the surfaces of the targets 25*a* and 25*b*, independently of the electrons supplied to the targets 25*a*,25*b* via the connection of the power source 34, so that the plasma is sustainable even at low process gas pressure by supplying more electrons than are lost to the outside of the plasma. In other words, a large supply of electrons through electron beam irradiation keeps the plasma 31 above the targets 25***a* and 25*b* even at low process gas pressure and enables sputtering by the plasma 31.

The targets 25*a* and 25*b* are composed of a plurality of targets so that deposition layers of various elements can be formed, and these targets 25*a* and 25*b* are rotatably mounted on the target mounting table 24. Among the plurality of targets 25*a* and 25*b*, a plasma is generated and sustained on a target irradiated with an electron beam from the electron beam supply module 30, so that sputtered target atoms are minimized in collisions with the process gas and thus deposited on the substrate 26 at low process gas pressure with high energy.

Therefore, according to one embodiment of the present disclosure, a much denser, lower defect, higher quality thin film may be obtained using a thin film fabrication process of a currently commercially available conventional plasma sputtering device.

In addition, according to one embodiment of the present disclosure, the vacuum chamber 20 may further include a process gas supply 33 installed to supply the process gas to the surface of a target. Since the overall process gas pressure in the vacuum chamber 20 is low, the distribution of process gas generally remains low even on the surfaces of the targets 25*a* and 25*b*. Since a large number of vacuum gas atoms colliding with electrons is required to generate a plasma, it is more favorable to generate a plasma by directly supplying process gas to the surfaces of the targets 25*a* and 25*b* through the process gas supply 33. In this case, the overall process gas pressure in the vacuum chamber 20 does not increase due to the vacuum gas supplied through the process gas supply 33, and the process gas pressure is controlled to remain within the range of 1×10-5 to 5×10-3 torr described above.

In addition, a shielding plate 32 may be installed in the process gas supply 33 to direct the process gas to the surfaces of the target 25*a*, 25*b*. From inside this shielding plate 32, the process gas is injected by the process gas supply 33 onto the surfaces of the targets 25*a* and 25*b*, thereby probabilistically increasing the generation of ions through collisions with electrons on the targets.

In addition, a magnetic field generating means 27 may be installed on the targets 25*a* and 25*b*. This magnetic field generating means 27 guide the direction of the electron beam 30*a* irradiated from the electron beam supply module 30 toward the surfaces of targets 25*a* and 25*b*, thereby enhancing the deposition efficiency by increasing the probability of electron collisions with the process gas on the surfaces of the targets. This magnetic field generating means 27 may be formed in a ring shape with circular or elliptical tracks and may be either an electromagnet or a permanent magnet.

However, according to one embodiment of the present disclosure illustrated in FIG. 4, the targets 25*a* and 25*b* and the substrate 26 are respectively installed on first and second sides of the vacuum chamber 20, which oppose each other, and the electron beam supply module 30 is also installed on the second side, where the substrate 26 is installed, to face the targets 25*a* and 26*b*. As a result, the majority of target atoms 31*a* sputtered by a plasma fly toward the substrate 26 and are then deposited thereon, while a portion of the sputtered target atoms 31*b* fly toward the electron beam supply module 30 and are then deposited thereon, potentially leading to contamination inside the electron beam supply module 30.

Figure 5:
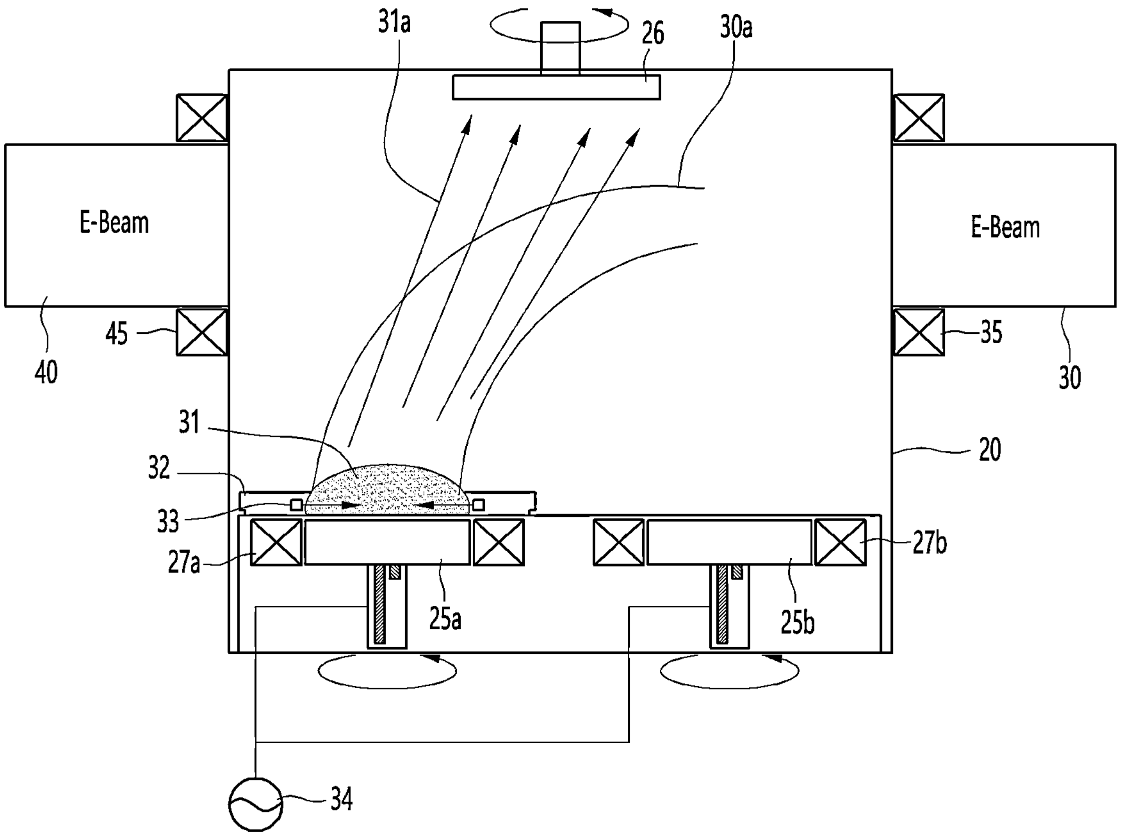
FIG. 5 is a diagram illustrating a second embodiment of an electron-beam-assisted sputtering device and a method therefor according to the present disclosure.
Figure 6:
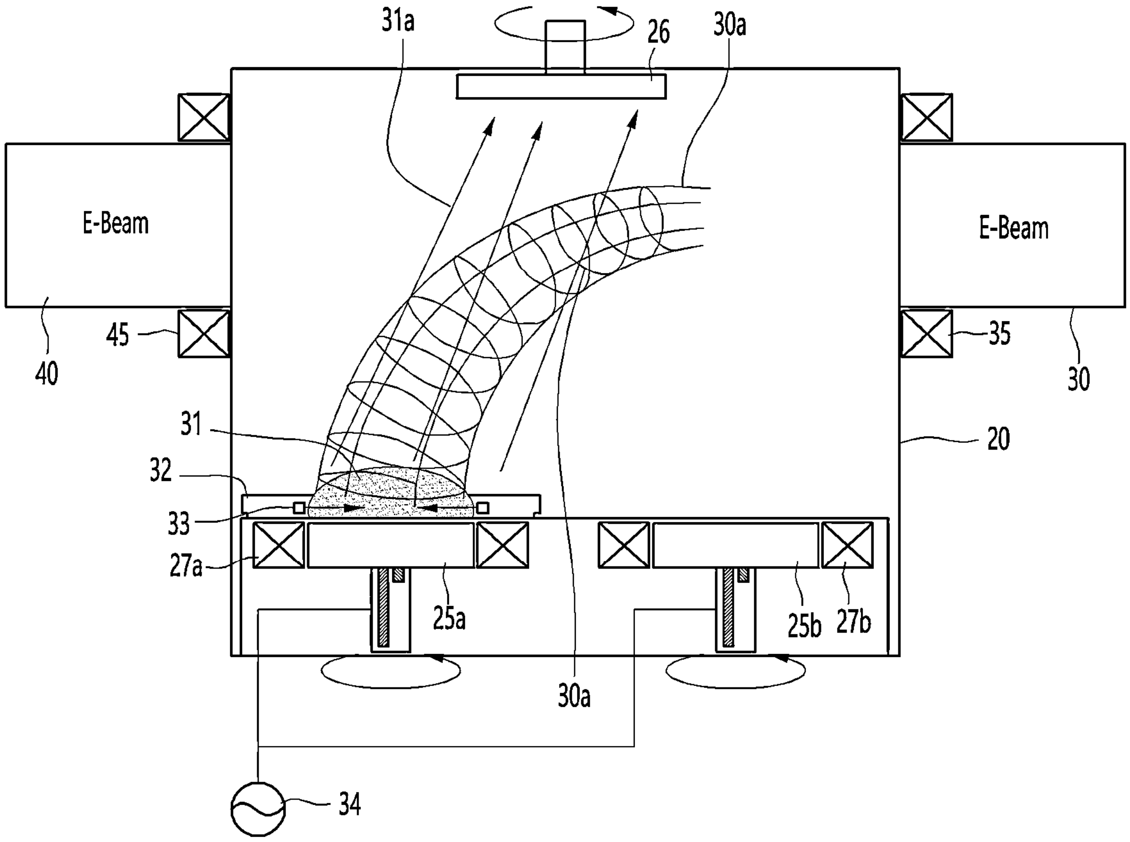
FIG. 6 is a diagram schematically illustrating the principle of the electron-beam-assisted sputtering device of FIG. 5.

FIGS. 5 and 6 show a second embodiment of an electron-beam-assisted sputtering device and a method therefor according to the present disclosure, which addresses the contamination of the electron beam supply module 30.

According to this embodiment, in the electron-beam-assisted sputtering device, targets 25*a* 25*b* and a substrate 26 are respectively installed on first and second sides (horizontal sides) of a vacuum chamber 20, which oppose each other, and electron beam supply modules 30 and 40 are installed on a different side (vertical side) other than the first and second sides, where the targets 25*a* and 25*b* and the substrate 26 are installed, so as not to face the target 25*a*, 25*b*. In addition, ring-shaped magnetic field generating means 35 and 45 are respectively installed in the electron beam supply modules 30 and 40, and ring-shaped magnetic field generating means 27*a* and 27*b* are installed in the targets 25*a* and 25*b* as well. These magnetic field generating means 35, 45, 27*a*, and 27*b* are installed to guide the direction of electron beams irradiated from the electron beam supply modules 30 and 40 to the targets 25*a* and 25, and as described above, each of the magnetic field generating means 35, 45, 27*a*, and 27*b* may be formed in a ring shape with circular or elliptical tracks and may be either an electromagnet or a permanent magnet.

As shown in FIG. 5, when the magnetic field generating means 35 of the electron beam supply module 30 located at the top right and the magnetic field generating means 27*a* of the target 25*a* located at the bottom left are controlled together, two magnetic fields converge, creating a curved B-field as depicted in FIG. 6, and an electron beam 30*a* irradiated from the electron beam supply module 30 is guided along the inside of the curved B-field, flying towards the surface of the target 25*a*. As a result, even though the electron beam supply module 30 is installed on the different side (vertical side) not facing the target 25*a*, the majority of the irradiated electron beam may be appropriately guided to the surface of the target 25*a*.

In contrast, target atoms 31*a* sputtered by a plasma 31 fly towards the substrate 26 disposed on the side (horizontal side) facing the targets 25*a* and 25*b* and are then deposited thereon, and the electron beam supply module 30 positioned on the side (vertical side) not facing the targets 25*a* and 25*b* prevents contamination caused by the sputtered target atoms 31*a* flying towards the targets 25*a* and 25*b*.

Figure 7:
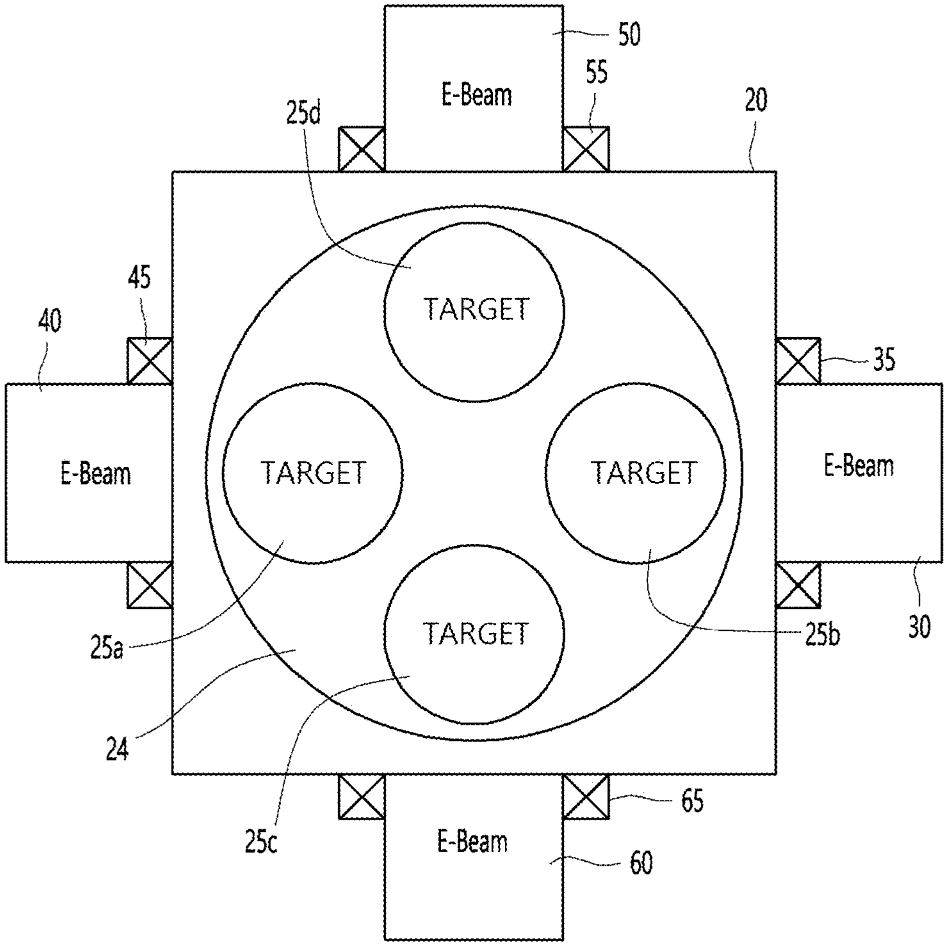
FIG. 7 is a diagram illustrating a third embodiment of an electron-beam-assisted sputtering device using multiple targets and method according to the present disclosure.

FIG. 7 shows a third embodiment of an electron-beam-assisted sputtering device and a method therefor according to the present disclosure, presenting a plan view of a system viewed from above. In this embodiment, in an electron beam-assisted sputtering device, four targets 25*a*, 25*b*, 25*c*, and 25*d* are mounted on a rotatable target mounting table 24 located under a vacuum chamber 20, and four electron beam supply modules 30, 40, 50, and 60 corresponding to the four targets 25*a*, 25*b*, 25*c*, and 25*d* are installed on a vertical side of the vacuum chamber 20.

Ring-shaped magnetic field generating means 35, 45, 55, and 65 are respectively installed at the four electron beam supply modules 30, 40, 50, and 60. Although not shown in the drawing, ring-shaped magnetic field generating means may be respectively installed at the four targets 25*a*, 25*b*, 25*c*, and 25*d*. These magnetic field generating means 35, 45, 55, and 65 are installed to guide the direction of an electron beam irradiated from the electron beam supply modules 30, 40, 50, and 60 to the targets 25*a*, 25*b*, 25*c*, and 25*d*, and as described above, each of the magnetic field generating means 35, 45, 55, and 65 may be formed in a ring shape with circular or elliptical tracks and may be either an electromagnet or a permanent magnet.

According to the electron-beam-assisted sputtering device and a method therefor of this embodiment, various types of target atoms may be deposited on a substrate. For the deposited atoms, various metal elements (e.g., Si, Ti, Mo, Cu, Al, Cr, Ni, C, etc.) or various other solid materials such as ceramics and transparent conductive films (e.g., ITO) are used. For instance, in the case of a blank mask for a semiconductor EUV lithography process, a multilayer reflective film is formed by alternately depositing layers of silicon (Si) and molybdenum (Mo), followed by the application of a protective film made of ruthenium (Ru) or a ruthenium alloy, and an absorber film composed of tantalum (Ta) or a tantalum alloy. Therefore, according to this embodiment of the electron beam-assisted sputtering device, the four targets 25*a*, 25*b*, 25*c*, and 25*d* formed of silicon, molybdenum, ruthenium, and tantalum are provided, and the four electron beam supply modules 30, 40, 50, 60 corresponding to the respective targets operate sequentially to form four types of deposition films onto the substrate. Consequently, it is possible to manufacture a blank mask for EUV by using just one electron beam-assisted sputtering device.

Figure 8:
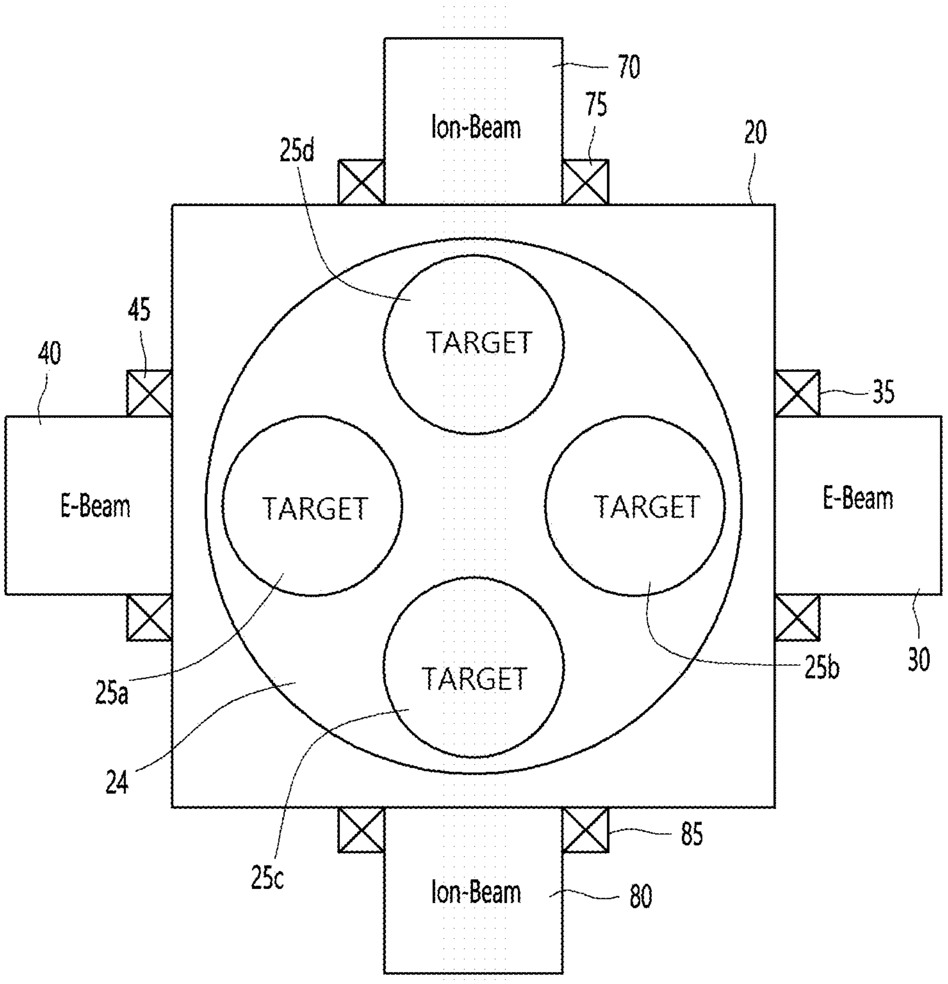
FIG. 8 is a diagram illustrating a fourth embodiment of an electron-beam-assisted sputtering device and a method therefor according to the present disclosure.

FIG. 8 shows a fourth embodiment of an electron-beam-assisted sputtering device and a method therefor according to the present disclosure, presenting a plan view of a system viewed from above. According to this embodiment, four targets 25*a*, 25*b*, 25*c*, and 25*d* are mounted on a rotatable target mounting table 24 located under a vacuum chamber 20, and two electron beam supply modules 30 and 40 and two ion beam supply modules 70 and 80 are installed on vertical sides of the vacuum chamber 20, respectively.

Ring-shaped magnetic field generating means 35, 45, 75, and 85 are respectively installed at the two electron beam supply modules 30 and 40 and the two ion beam supply modules 70 and 80. Although not shown in the drawing, ring-shaped magnetic field generating means may be respectively installed at the four targets 25*a*, 25*b*, 25*c*, and 25*d*. These magnetic field generating means 35, 45, 75, and 85 are installed to guide the direction of electron beams irradiated from the electron beam supply module 30 and 40 and the direction of ion beams irradiated from the ion beam supply modules 70 and 80 to the targets 25*a*, 25*b*, 25*c*, and 25*d*, and as described above, each of the magnetic field generating means 35, 45, 75, and 85 may be formed in a ring shape with circular or elliptical tracks and may be either an electromagnet or a permanent magnet.

Accordingly, for the two targets 25*a* and 25*b* corresponding to the electron beam supply modules 30 and 40, target materials subject to a plasma sputtering process using an electron beam may be mounted, and for the other two targets 25*c* and 25*d* corresponding to the ion beam supply modules 70 and 80, target materials subject to a sputtering process using an ion beam may be mounted. For example, in fabricating a blank mask for EUV, a multilayer reflective film, where silicon and molybdenum are alternately deposited, may be fabricated using an ion-beam sputtering process, while protective and absorber films composed of ruthenium and tantalum may be fabricated using a plasma sputtering process. Such a fabricating process in which the ion beam sputtering process and the plasma sputtering process are used alternately may be fabricated using only one electron-beam-assisted sputtering device according to the present embodiment.

Figure 9:
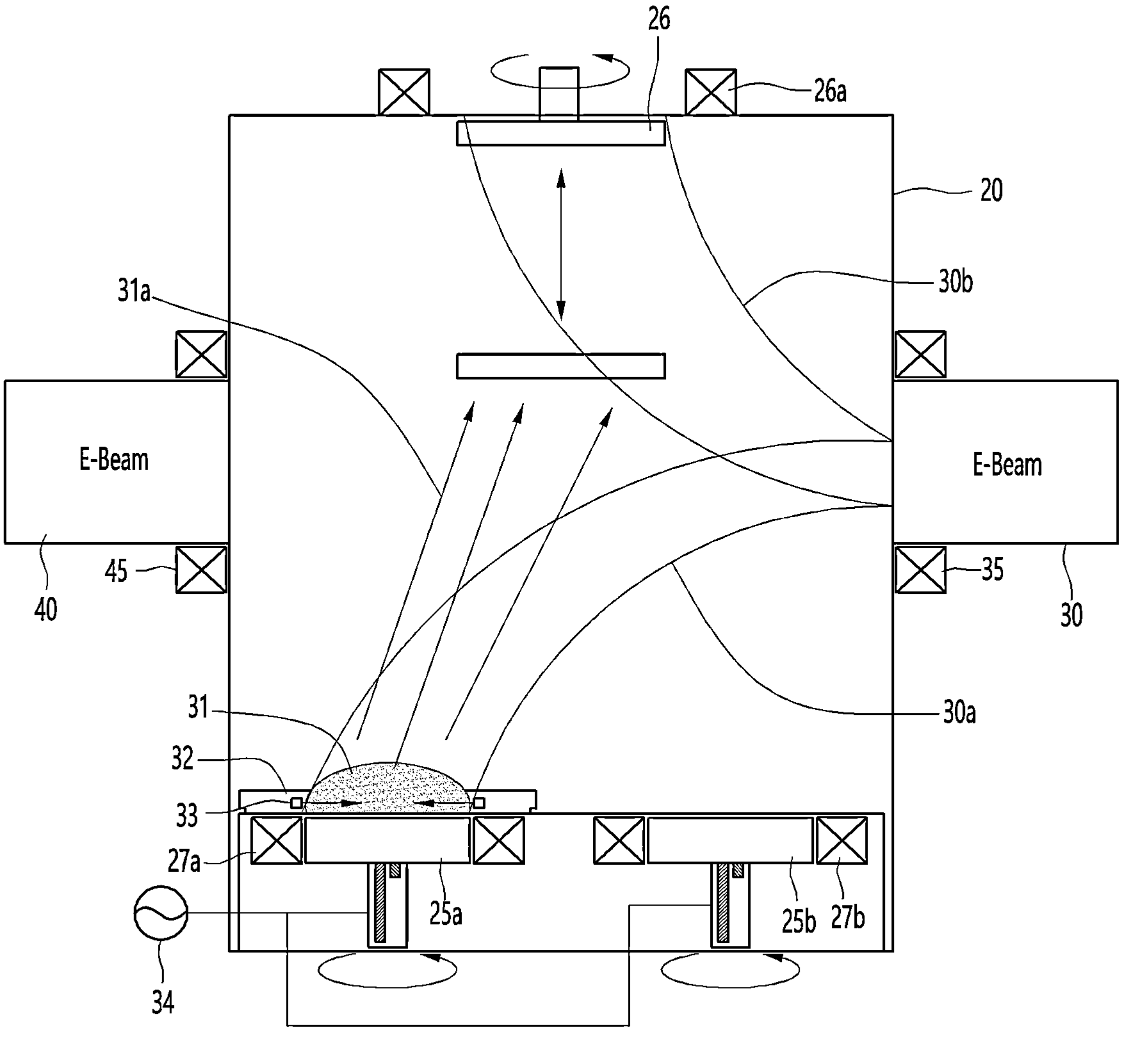
FIG. 9 is a diagram illustrating a fifth embodiment of an electron-beam-assisted sputtering device and a method therefor according to the present disclosure.

FIG. 9 shows a fifth embodiment of an electron-beam-assisted sputtering device and a method therefor according to the present disclosure. According to this embodiment, the electron-beam-assisted sputtering device is installed to allow a substrate 26 to move a predetermined distance inside a vacuum chamber 20. In addition, targets 25*a* and 25*b* and a substrate 26 are respectively installed on first and second sides (horizontal sides) of the vacuum chamber 20, which oppose each other, and electron beam supply modules 30 and 40 are installed on different sides (vertical side) other than the first and second sides, where the targets 25*a* and 25*b* and the substrate 26 are installed, not to face the targets 25*a* and 25*b*, and similar to the embodiment shown in FIG. 5, ring-shaped magnetic field generating means 35 and 45 are respectively installed at the electron beam supply modules 30 and 40, and ring-shaped magnetic field generating means 27*a* and 27*b* are installed at the targets 25*a* and 25*b*, and thus, detailed descriptions regarding the functions of each component are deferred to the description of FIG. 5.

Electron beams irradiated from the two electron beam supply modules 30 and 40 to the target 25*a*, 25*b* serve two main functions. One of the functions is to supply sufficient electrons to a surface of a target, allowing a plasma to be generated and sustained even at low process gas pressures, and the other function is to apply vibrational energy to atoms on a surface of a deposition film during irradiation of the deposition film with the electron beam, thereby rearranging surface atoms to remove bubbles or impurities. The latter case is called electron beam annealing, which facilitates the formation of a high-quality deposition film.

According to this embodiment, this electron beam annealing may be applied to the substrate 26. First, the substrate 26 is moved to the center of the vacuum chamber 20, and then, when a plasma 31 is formed by operating the electron beam supply module 30 to irradiate the surface of the target 25*a* with an electron beam 30*a*, sputtered target atoms 31*a* fly toward the substrate 26 and are then deposited onto the surface of the substrate 26 with retaining high energy. Subsequently, the substrate 26 is moved upward, and when the direction of the magnetic field is changed by reversing the current flow in a ring-shaped magnetic field generating means 35 installed in the electron beam supply module 30, the electron beam 30*b* is irradiated upwards onto the substrate where a thin film is deposited.

As a result, after E-beam sputtering or ion beam sputtering without breaking the vacuum of the vacuum chamber 20, the surface of the deposited thin film may be irradiated with an electron beam to rearrange the surface atoms, thereby improving the properties of the thin film, such as eliminating surface defects of the thin film.

Meanwhile, according to another embodiment of the present disclosure, when a linear target is used, irradiating a linear electron beam toward the linear target using a linear electron beam supply module that conforms to the shape of the linear target may be used as a method to increase the efficiency of deposition even in the case of large-area deposition.

According to yet another embodiment of the present disclosure, it is also applicable to a sputtering process using a target of magnetic material, which is conventionally impossible. In a conventional plasma sputter process, when a target is formed of a magnetic material such as Fe, Co, or Ni, it is challenging for a magnetic field generated by a magnet attached to a sputtering gun itself to reach the surface of the magnetic material target, and in other words, when the target is formed of a magnetic material, the magnetic field may be weakened, leading to weakening or dissipation of a plasma, thereby making sputtering deposition impossible.

However, with the electron-beam-assisted sputtering device of the present disclosure, electrons supplied in a direction toward the substrate may reduce the mean free path in a plasma, allowing operation even at lower process gas pressures, and thus, a magnetic material target may be used. This is achievable with an ion beam as well, but deposition is possible without the deposition of a contamination source due to the space charge effect, and thus, high-purity deposition may be implemented.

The technical features disclosed in each embodiment of the present disclosure are not limited to a corresponding embodiment, and unless incompatible with each other, the technical features disclosed in each embodiment may be applied in combination to other embodiments.

Therefore, although each embodiment is described mainly about an individual technical feature, the technical features of the embodiments of the present disclosure may be applied in combination, unless incompatible with each other. The present disclosure is not limited to the above-described embodiments and the accompanying drawings, and various modifications and changes may be made in view of a person skilled in the art to which the present disclosure pertains. Therefore, the scope of the present disclosure should be determined by the scope of the appended claims, and equivalents thereof.

[DESCRIPTION OF REFERENCE NUMERALS]

| | |
|---|---|
| 10, 20: sputtering chamber | 11, 21: pump |
| 12, 22: valve | 23: ion beam source |
| 24: target mounting table | 14. 25a, 25b: target |
| 17, 26: substrate | 27: magnetic field generating mean |
| 30. 40. 50. 60: electron beam supply module | 30a, 30b: electron beam |
| 16, 31: plasma | 31a, 31b: target atom |
| 32: shielding plate | 33: gas supply |
| 15, 34: power source | 35, 45, 55, 65: magnetic field generating means |
| 70, 80: ion beam supply module | 75, 85: magnetic field generating means |

What is claimed is:

1. An electron-beam-assisted sputtering device comprising:

a vacuum chamber where process gas for formation of a plasma is filled at a predetermined process gas pressure;

a target mounted within the vacuum chamber and supplied with power;

a substrate where target atoms, sputtered by strong collision with the target by cations of the process gas present in the plasma formed on a surface of the target, are deposited; and an electron beam supply module configured to supply electrons toward the surface of the target where the plasma is formed, to maintain the plasma;

wherein magnetic field generating means are respectively installed at both the electron beam supply module and around the target to form a magnetic field tunnel that guides a trajectory of an electron beam along a curved path toward the target, such that the target and the electron beam supply module are positioned so as not to face each other and the target is located at a distance from the electron beam supply module, thereby preventing contamination of the electron beam supply module during sputter deposition.

2. The electron-beam-assisted sputtering device of claim 1, wherein the process gas pressure is within a range of $1\times10^{-5}$ to $5\times10^{-4}$ torr.

3. The electron-beam-assisted sputtering device of claim 1, further comprising:

a process gas supply installed within the vacuum chamber to supply the process gas toward the surface of the target.

4. The electron-beam-assisted sputtering device of claim 3, wherein a shielding plate is installed on the process gas supply to direct the process gas toward the surface of the target.

5. The electron-beam-assisted sputtering device of claim 1, wherein the magnetic field generating means comprises an electromagnet or a permanent magnet.

6. The electron-beam-assisted sputtering device of claim 1, wherein the electron beam supply module is configured to supply electron beams toward both the target and the substrate.

7. The electron-beam-assisted sputtering device of claim 6, wherein the electron beam supply module is provided as a single electron beam supply module capable of supplying an electron beam toward both the target and the substrate by changing a direction of the electron beam.

8. The electron-beam-assisted sputtering device of claim 6, wherein the electron beam supply module comprises two or more separate electron beam supply modules supplying electron beams toward the target and the substrate, respectively.

9. The electron-beam-assisted sputtering device of claim 1, further comprising an ion beam source additionally installed within the vacuum chamber to irradiate a separate additional ion beam onto the surface of the target or another target to sputter the target atoms.

10. The electron-beam-assisted sputtering device of claim 1, wherein the target is a magnetic material target.

11. An electron-beam-assisted sputtering method, comprising:

wherein a vacuum chamber is filled with a process gas at a predetermined process gas pressure to form a plasma within the vacuum chamber, wherein an electron beam is irradiated from an electron beam supply module installed within the vacuum chamber toward the plasma formed on the surface of the target, wherein magnetic field generating means are respectively installed at both the electron beam supply module and the target to form a magnetic channel that guides a trajectory of an electron beam along a non-linear path toward the target.

12. The electron-beam-assisted sputtering method of claim 11, wherein the process gas pressure is controlled within a range of $1\times10^{-5}$ to $5\times10^{-4}$ torr.

13. The electron-beam-assisted sputtering method of claim 11, further comprising a process gas supply installed within the vacuum chamber to separately supply the process gas to the surface of the target.

14. The electron-beam-assisted sputtering method of claim 11, wherein the electron beam supply module supplies an electron beam toward both the target and the substrate.

15. The electron-beam-assisted sputtering method of claim 14, wherein the electron beam supply module is provided as a single electron beam supply module capable of supplying an electron beam toward both the target and the substrate by changing a direction of the electron beam.

16. The electron-beam-assisted sputtering method of claim 15, wherein the substrate is vertically movable within the vacuum chamber relative to the target, wherein in response to the substrate moving downwardly, the magnetic field generating means guides a direction of an electron beam irradiated from the electron beam supply module to the target, thereby supplying the electron beam to the surface of the target so that the plasma is generated and maintained even under low process gas pressure, and wherein in response to the substrate moving upwardly, the magnetic field generating means guides a direction of an electron beam irradiated from the electron beam supply module to the substrate, thereby applying vibrational energy to the target atoms being deposited on the substrate so that the target atoms are rearranged.

17. The electron-beam-assisted sputtering method of claim 14, wherein the electron beam supply module is provided as two or more electron beam supply modules, and the supplying of an electron beam toward the target and the supplying of an electron beam toward the substrate are performed by separate electron beam supply modules, respectively.

18. The electron-beam-assisted sputtering method of claim 14, wherein the electron beam supply module irradiates the target with an electron beam during plasma sputtering deposition, and irradiates the substrate with an electron beam during the sputtering deposition or after the sputtering deposition is fully or partially completed.

19. The electron-beam-assisted sputtering method of claim 11, wherein an ion beam source is additionally installed within the vacuum chamber to irradiate an additional ion beam onto the surface of the target or a separate target, thereby sputtering the target atoms.

20. The electron-beam-assisted sputtering device of claim 1, wherein the substrate is vertically movable within the vacuum chamber relative to the target, and wherein in response to the substrate moving downwardly, the magnetic field generating means guides a direction of an electron beam irradiated from the electron beam supply module to the target, thereby supplying the electron beam to the surface of the target so that the plasma is generated and maintained even under low process gas pressure, and wherein in response to the substrate moving upwardly, the magnetic field generating means guides a direction of an electron beam irradiated from the electron beam supply module to the substrate, thereby applying vibrational energy to the target atoms being deposited on the substrate so that the target atoms are rearranged.

* * * * *